United States Patent
Lunsman et al.

(10) Patent No.: US 10,888,023 B2
(45) Date of Patent: Jan. 5, 2021

(54) LEAK MITIGATION SYSTEM FOR A COOLING SYSTEM

(71) Applicant: HEWLETT PACKARD ENTERPRISE DEVELOPMENT LP, Houston, TX (US)

(72) Inventors: Harvey Lunsman, Chippewa Falls, WI (US); John Franz, Houston, TX (US); Benjamin Kufahl, Chippewa Falls, WI (US); Matthew Slaby, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 151 days.

(21) Appl. No.: 16/132,679

(22) Filed: Sep. 17, 2018

(65) Prior Publication Data
US 2020/0093033 A1    Mar. 19, 2020

(51) Int. Cl.
*F04B 53/08*     (2006.01)
*H05K 7/20*      (2006.01)
*G01M 3/28*      (2006.01)

(52) U.S. Cl.
CPC ......... *H05K 7/20272* (2013.01); *F04B 53/08* (2013.01); *G01M 3/2815* (2013.01); *H05K 7/20645* (2013.01)

(58) Field of Classification Search
CPC .......... H05K 7/20272; H05K 7/20645; G01M 3/2815; F04B 43/009; F04B 53/08
See application file for complete search history.

(56) References Cited

U.S. PATENT DOCUMENTS

| | | | | |
|---|---|---|---|---|
| 2,628,476 A | * | 2/1953 | Grier | F02N 7/08 60/402 |
| 3,612,724 A | * | 10/1971 | Smith | F04B 1/324 417/222.1 |
| 5,323,847 A | | 6/1994 | Koizumi et al. | |
| 9,839,164 B2 | | 12/2017 | Shelnutt et al. | |
| 9,869,983 B2 | | 1/2018 | Buvid et al. | |
| 2003/0213245 A1 | * | 11/2003 | Yates | F01K 17/02 60/651 |

(Continued)

OTHER PUBLICATIONS

Electronics Cooling Magazine, "Liquid Cooled Data Center with More Power and No Leakage," Jul. 5, 2016, pp. 1-7 (online), ITEM Media, Retrieved from the Internet on Jun. 6, 2018 at URL: <electronics-cooling.com/2016/07/liquid-cooled-data-center-with-more-power-and-no-leakage/>.

*Primary Examiner* — Peter J Bertheaud
*Assistant Examiner* — Dnyanesh G Kasture
(74) *Attorney, Agent, or Firm* — Nolte Intellectual Property Law Group

(57) ABSTRACT

A leak mitigation system for a cooling system may include an isolation valve, a controller, and a computer-readable medium. The isolation valve may selectively isolate an expansion tank from a closed loop containing a coolant circulated by a primary pump having a pump inlet. The expansion tank may maintain the coolant at a predetermined pressure at the pump inlet in the closed loop. The controller may communicate with the primary pump and the isolation valve. The computer-readable storage medium may include instructions executable by the controller to: in response to a detection of a leak of the coolant from the closed loop, shut down the primary pump; and close the isolation valve to isolate the expansion tank from the closed loop.

17 Claims, 5 Drawing Sheets

(56) References Cited

U.S. PATENT DOCUMENTS

| | | | |
|---|---|---|---|
| 2007/0022749 A1* | 2/2007 | Singh | B60K 6/12 |
| | | | 60/414 |
| 2015/0308318 A1* | 10/2015 | Gibble | F01N 5/02 |
| | | | 60/615 |
| 2015/0355630 A1 | 12/2015 | Cader et al. | |
| 2016/0270267 A1* | 9/2016 | Chainer | H05K 7/20781 |
| 2018/0010554 A1* | 1/2018 | Foege | F02M 21/06 |

* cited by examiner

LEAK MITIGATION SYSTEM FOR A COOLING SYSTEM

BACKGROUND

Electronic components (e.g., processing and memory components) included in computing devices, such as servers, generate heat during their operation. Accordingly, to prevent damage to the electronic components, cooling systems have been implemented in many computing devices to maintain the electronic components at acceptable operational temperatures. Generally, cooling systems may utilize a cooling fluid to absorb thermal energy from the electronic components. In some instances, the cooling fluid may be a gas, such as air, and may directly contact the electronic component(s) to transfer thermal energy from the electronic component(s) to the cooling fluid. In other instances, the cooling fluid may be a liquid, such as water or oil, and may be brought into thermal contact with the electronic component(s) via one or more cooling blocks or piping.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
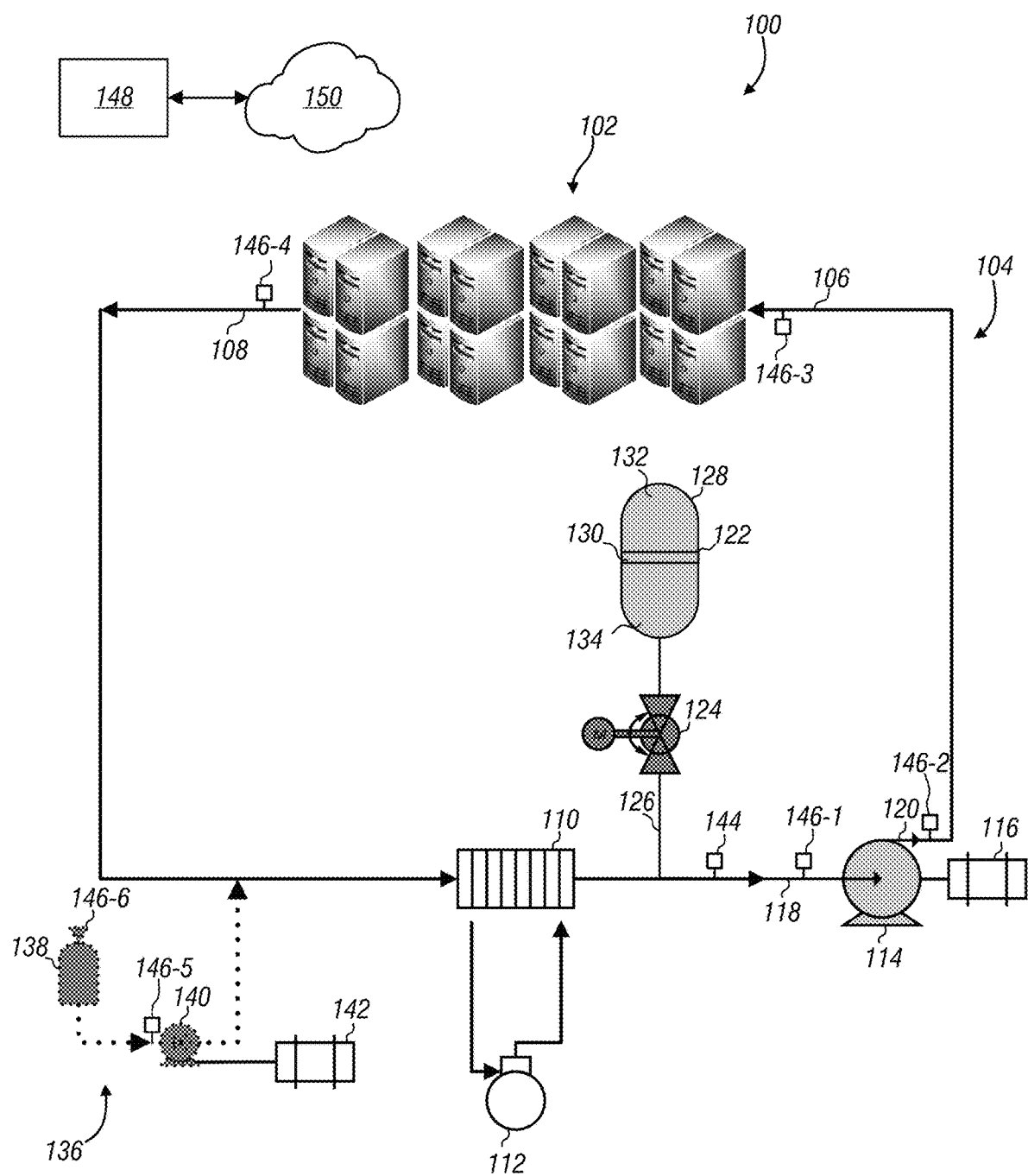
FIG. 1 is a schematic of a cooling system for one or more computing devices, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means plus or minus 10% of the value, unless otherwise expressly specified. Moreover, examples herein are intended to be illustrative only and are presented for discussion purposes and not by way of limitation.

As central processing units (CPUs), graphical processing units (GPUs), and other electronic components (e.g., memory devices) decrease in size, computing devices, such as servers, are in turn able to increase the number of such electronic components utilized. Likewise, server racks, such as high-density server racks, have been constructed to house an increased number of servers for certain computing applications. Established air-cooling systems, such as computer room air conditioner (CRAC) units, typically are not able to provide a sufficient cooling air flow through the high-density server racks. In addition, generating sufficient air flow via a forced air method may lead to excessive energy consumption by the fans and/or compressors generating the forced air.

Thus, liquid cooling may be implemented in such environments to utilize the naturally high heat absorption of liquids. In one implementation, liquid cooling may be carried out through the use of piping containing a liquid coolant placed in thermal contact with the electronic components to be cooled. In some implementations, the piping may be coupled to cold plates or heat sinks coupled to the electronic components to cool the electronic components.

The piping may further interconnect a multitude of components to form a closed cooling loop. An example closed cooling loop may include a pump to circulate a liquid coolant through one or more server racks to absorb heat generated by the electronic components contained in a plurality of computing devices (e.g., servers) housed in one or more chassis or like enclosures installed in the server racks. The closed cooling loop may further include a heat exchanger to transfer the heat absorbed by the liquid coolant to an external cooling facility.

Although liquid cooling utilizing a closed cooling loop is effective for cooling electronic components in a multitude of server implementations, a compromise or breach of the closed cooling loop may result in the leakage of liquid coolant from the closed cooling loop. In such cases, the internal pressure in the closed cooling loop may drive the liquid coolant from the closed cooling loop to the surrounding environment. Generally, the leakage of liquid coolant, if not remedied, will continue until a pressure differential no longer exists between the fluid inside the closed cooling loop and the external atmosphere. In a surrounding environment including electrical equipment or other equipment susceptible to damage from the liquid coolant, such a prolonged leak may result in the damage or destruction of such equipment and considerable expense to repair and replace the equipment.

Accordingly, multiple implementations have been established in the art to mitigate leaks in closed cooling loops. In one example implementation to address a leakage of liquid coolant from a closed cooling loop, valves are placed at the inlet of the piping to each server rack or to each enclosure or chassis in each server rack. Thus, in the event a leak is detected in a particular chassis or server rack, the respective valve permitting flow into such chassis or server rack is closed, thereby preventing the flow of additional liquid coolant to the leak and isolating the leak from the remainder of the closed cooling loop. Although such valving may mitigate the leakage of the liquid coolant from the closed cooling loop, certain drawbacks are apparent from such an implementation. For instance, the valves and their associated actuators positioned at the inlet of the piping to each server rack or to each enclosure or chassis in each server rack occupy a large amount of physical space, thereby eliminating such space for other useful components. In addition, the number of inputs and outputs associated with the valves and actuators to control each valve and actuator adds to the complexity of such an implementation.

In another implementation addressing a leakage of liquid coolant from a closed cooling loop, portions of the closed cooling loop are maintained at a pressure less than atmospheric pressure (i.e., a partial vacuum), such that any leak developing in the portions of the closed cooling loop at a partial vacuum pressure would draw air into the closed cooling loop instead of driving liquid coolant out of the closed cooling loop. However, such an implementation has been found to be ineffective for portions of the closed cooling loop that are not maintained at a partial vacuum. In addition, the equipment provided for maintaining portions of the closed cooling loop at a partial vacuum introduces cost and complexity into the closed cooling loop.

Examples of the present disclosure are directed to leak mitigation systems and cooling systems incorporating such leak mitigation systems that overcome the drawbacks of the aforementioned leak mitigation systems and cooling systems incorporating the aforementioned leak mitigation systems. Particularly, in one or more examples of the present disclosure, a leak mitigation system is provided that is capable of mitigating a leak in a cooling system via the shutdown of a pump circulating the liquid coolant through the cooling system and the actuation of a single valve to isolate an expansion tank from the cooling system. Accordingly, the use of a single valve in such a leak mitigation system to mitigate a leak in the cooling system reduces the complexity and the space occupied by the leak mitigation system in comparison to the implementations previously disclosed.

More particularly, in one example of the present disclosure, a leak mitigation system is provided and may include an isolation valve, a controller, and a computer-readable medium. The isolation valve may selectively isolate an expansion tank from a closed loop containing a coolant circulated by a primary pump having a pump inlet. The expansion tank may maintain the coolant at a predetermined pressure at the pump inlet in the closed loop. The controller may communicate with the primary pump and the isolation valve. The computer-readable storage medium may include instructions executable by the controller to: in response to a detection of a leak of the coolant from the closed loop, shut down the primary pump; and close the isolation valve to isolate the expansion tank from the closed loop.

In another example of the present disclosure, a cooling system for a computing device is provided and includes a closed loop, a controller, and a computer-readable medium. The closed loop may be configured to transfer thermal energy from the computing device to a coolant circulating though the closed loop. The closed loop may include a primary pump, an expansion tank, a heat exchanger, and an isolation valve. The primary pump may have a pump inlet and may be configured to circulate the coolant through the closed loop. The expansion tank may maintain the coolant at a predetermined pressure at the pump inlet when the expansion tank is fluidly coupled to the pump inlet. The heat exchanger may remove thermal energy from the closed loop. The isolation valve may selectively isolate the expansion tank from the closed loop. The controller may be communicatively coupled to the primary pump and the isolation valve. The computer-readable storage medium may include instructions executable by the controller to: in response to a detection of a leak of the coolant from the closed loop, shut down the primary pump; and close the isolation valve to isolate the expansion tank from the closed loop.

In another example of the present disclosure, a method for mitigating a leak in a cooling system having a closed loop is provided and includes detecting a leak of coolant from the closed loop. The method may also include shutting down a primary pump operable to circulate the coolant through the closed loop. The primary pump may have a pump inlet. The method may further include closing an isolation valve to isolate an expansion tank from the closed loop. The expansion tank may maintain the coolant at a predetermined pressure at the pump inlet in the closed loop when the expansion tank is fluidly coupled to the pump inlet.

Turning now to the drawings, FIG. 1 is a schematic of a cooling system 100 for one or more computing devices 102, according to one or more examples of the disclosure. In one or more implementations, the cooling system 100 may be utilized to cool a plurality of electronic components (not shown) in one or more computing devices 102. For example, the cooling system 100 of the present disclosure may be utilized to cool electronic components including, but not limited to, CPUs, GPUs, and memory devices, such as DIMMs. Computing devices 102 incorporating such electronic components may be, for example, servers, and in particular, may be server blades disposed in one or more server chassis (not shown) mountable to a server rack (also not shown). Each server chassis may be mounted to the server rack in a stacked arrangement, where a plurality of server chassis may be stacked above and below one another. In one or more implementations, the server rack may be included in a datacenter (not shown).

Accordingly, the cooling system 100 may include a closed loop 104 having tubing forming multiple branches (not shown) to distribute liquid coolant flowing therethrough to each computing device 102 to absorb heat generated by the electronic components contained in the respective computing devices 102 via cold plates or heat sinks (not shown) coupled to printed circuit boards (not shown) of each computing device 102. In one or more implementations, an integrated heat spreader (not shown) may transfer heat from an electronic component mounted to the printed circuit board to a respective cold plate. The tubing may be coupled to each cold plate to transfer heat from the cold plates to the liquid coolant flowing through the tubing. The branched tubing may extend from an inlet manifold (not shown) connected to a supply line 106 of the closed loop 104. The inlet manifold may be configured to distribute the liquid coolant to the electronic components of the computing device(s) 102. The branched tubing may further terminate in an outlet manifold (not shown) connected to a return line 108 of the closed loop 104. The outlet manifold may be configured to channel the liquid coolant to a component of the cooling system 100 downstream from the computing device(s) 102.

To that end, as illustrated in FIG. 1, the closed loop 104 includes a heat exchanger 110 disposed downstream from the one or more computing devices 102 and fluidly coupled to the return line 108. As shown in FIG. 1, the cooling system 100 includes an external cooling facility 112 in fluid communication with the heat exchanger 110 and configured to absorb heat from the liquid coolant flowing through the heat exchanger 110 via a cooling fluid supplied from the external cooling facility 112 and flowing through the heat exchanger 110. In one or more examples, the coolant provided from the external cooling facility 112 may be a liquid, such as water, and in such examples, the heat exchanger 110 may be a liquid-to-liquid heat exchanger. Example heat exchangers 110 may include, but are not limited to, brazed plate heat exchangers and open frame heat exchangers. In other examples, the coolant may be a gas, such as air, and in such examples, the heat exchanger 110 may be a liquid-to-air heat exchanger.

The closed loop 104 may also include a primary pump 114 configured to circulate the liquid coolant through the closed loop 104. As illustrated in FIG. 1, the primary pump 114 may be disposed downstream from the heat exchanger 110 and upstream from the one or more computing devices 102. The primary pump 114 may be fluidly coupled to the supply line 106 and configured to circulate the liquid coolant through the computing devices 102. A driver 116 may be operatively coupled with and configured to drive the primary pump 114. The driver 116 may be a fixed speed motor or a variable speed motor. In one or more implementations, the driver 116 is a variable speed drive (VSD).

The primary pump 114 includes a pump inlet 118 to draw the liquid coolant into the primary pump 114 at an inlet pressure and a pump outlet 120 to discharge the liquid coolant from the primary pump 114 at an outlet pressure greater than the inlet pressure. For example, the inlet pressure may be about 14.7 psi (1 atm or 101.3 kPa) and the outlet pressure may be about 40 psi (2.72 atm or 275.8 kPa). Accordingly, the pressure in the closed loop 104 will be the greatest at the pump outlet 120, and the pressure in the closed loop 104 will be at a minimum at the pump inlet 118 during standard operation of the cooling system 100. In one or more implementations, a filter (not shown) may be fluidly coupled to the pump outlet 120 to remove particulates from the liquid coolant discharged from the pump outlet 120.

As shown in FIG. 1, the closed loop 104 further includes an expansion tank 122 to maintain the inlet pressure of the primary pump 114 at a predetermined pressure. Maintaining the inlet pressure at a predetermined pressure may be advantageous for preventing pump cavitation and the resulting damage to internal components (e.g., blades) of the primary pump 114. The expansion tank 122 may be selectively fluidly coupled to the pump inlet 118 via an isolation valve 124 connected to line 126 fluidly coupling the expansion tank 122 to the pump inlet 118. In one or more implementations, the line 126 may have an outer diameter of about one inch (2.54 cm) or less. For example, the line 126 may have an outer diameter of about three-fourths of an inch (1.91 cm). In another example, the line 126 may have an outer diameter of about one-half of an inch (1.27 cm). Thus, the isolation valve 124 may be sized accordingly and may be capable of closing quickly (i.e., in less than about five seconds), thereby isolating the expansion tank 122 from the closed loop 104.

The expansion tank 122 defines a chamber 128 and includes a diaphragm 130, which may be formed from a flexible material such as rubber, disposed in the chamber 128 and separating the chamber 128 into a gas-filled section 132 and a liquid-filled section 134. In one or more implementations, the gas-filled section 132 may be charged with a gas (such as air) to have an initial pressure in the gas-filled section 132 equal to the predetermined pressure (for example, about at or above atmospheric pressure) while the isolation valve 124 is open. The liquid-filled section 134 is fluidly connected to the closed loop 104 while the isolation valve 124 is open, and thus is filled with liquid coolant from the closed loop 104 at a pressure equal to the inlet pressure for the primary pump 114. Thus, the gas in the gas-filled section 132 may compress or decompress based on the pressure of the liquid coolant in the liquid-filled section 134, and therefore the expansion tank 122 may absorb pressure changes at the inlet 118 and thereby help to maintain the inlet pressure at (or near) the predetermined pressure. In some examples, the predetermined pressure is about 14.7 psi (101.3 kPa). At such a pressure, pump cavitation may be prevented at the pump inlet 118.

When it said herein that the expansion tank 122 maintains the inlet pressure at the predetermined pressure, this should be understood to mean that the expansion tank 122 tends to offset or absorb pressure changes at the inlet 118, but not that the expansion tank 122 necessarily perfectly maintains the inlet pressure at a fixed pressure. In other words, it may be possible for conditions to cause the inlet pressure to move away from the predetermined pressure, despite the expansion tank 122, but the presence of the expansion tank 122 will tend to reduce the magnitude of the change in inlet pressure.

In conjunction with the expansion tank 122, the cooling system 100 may further include a coolant fill system 136 to help maintain the inlet pressure at the pump inlet 118 at the predetermined pressure. As shown in FIG. 1, the coolant fill system 136 includes a liquid coolant source 138 and a secondary pump 140 fluidly coupling the liquid coolant source 138 to the closed loop 104. A driver 142 may be operatively coupled with and configured to drive the secondary pump 140. The driver 142 may be a fixed speed motor or a variable speed motor. In one or more implementations, the driver 142 is a single speed motor.

The secondary pump 140 may be activated to draw liquid coolant from the liquid coolant source 138 to the pump inlet 118 in the closed loop 104 to provide additional liquid coolant to the closed loop 104. In one or more implementations, a filter (not shown) may be fluidly coupled to the secondary pump 140 to remove particulates from the liquid coolant to be provided to the closed loop 104 from the liquid coolant source 138. The liquid coolant source 138 may be a tank or reservoir containing a supply of the liquid coolant. In one or more implementations, the liquid coolant in the liquid coolant source 138 and the liquid coolant flowing through the closed loop 104 may be the same and may be or include water. For example, in some implementations, the liquid coolant may be water including chemical treatment additives, such as corrosion inhibitors. In other implementations, the liquid coolant may be a mixture of water and glycol to prevent freezing of the liquid coolant.

The closed loop 104 may include a pressure transducer 144 configured to measure the pressure at the pump inlet 118. In response to the measured pressure being less than the predetermined pressure, the secondary pump 140 may be activated to draw liquid coolant from the liquid coolant source 138 and into the closed loop 104 at the pump inlet 118 until the measured pressure is the predetermined pressure. Once the measured pressure is substantially equal to the predetermined pressure, the secondary pump 140 may be shutdown (e.g., powered off). At such time, the pressure at the pump inlet 118 may be substantially equal to the pressure in the gas-filled section 132 of the expansion tank 122. Accordingly, the inlet pressure may be maintained at a positive pressure (e.g., the predetermined pressure) even in instances in which the primary pump 114 is shutdown.

In addition to the pressure transducer 144, the cooling system 100 may include a plurality of sensors 146-1 through 146-6 (also referred to collectively as sensors 146 or individually and generally as a sensor 146) positioned at a multitude of locations within the closed loop 104 to detect pressures, flow rates, temperatures, and levels of the liquid coolant at the respective locations of the sensors 146. For example, the cooling system 100 may include one or more sensors 146 in or at the pump inlet 118, the pump outlet 120, the liquid coolant source 138, the supply line, and the return line. The detected pressures, flow rates, temperatures, and conductivity of the liquid coolant may be indicative of a leak of liquid coolant from the closed loop 104.

The cooling system 100 may further include a controller 148 communicatively coupled to other components of the cooling system 100. For example, the controller 148 may be communicatively coupled to the primary pump 114, the secondary pump 140, the isolation valve 124, the pressure transducer 144, and the plurality of sensors 146. In other examples, the controller 148 may also be communicatively coupled to the heat exchanger 110 and the expansion tank 122. The controller 148 may be communicatively coupled to some or all of the components via a wired connection, or as shown in FIG. 1, via a wireless connection. Each of the components may be in communication with the controller 148 via a network 150. The network 150 may be a private network, or in other implementations, the network 150 may be a public network, such as the Internet. As used herein, a public network is a network that may be shared by any number of entities. A public network may have unrestricted access, such that any user may connect to it. The network 150 may include any number of intermediate network devices, such as switches, routers, gateways, and/or servers, that are not directly illustrated as part of the network 150 but that facilitate communication between the controller 148 and the other components of the cooling system 100.

Figure 2:
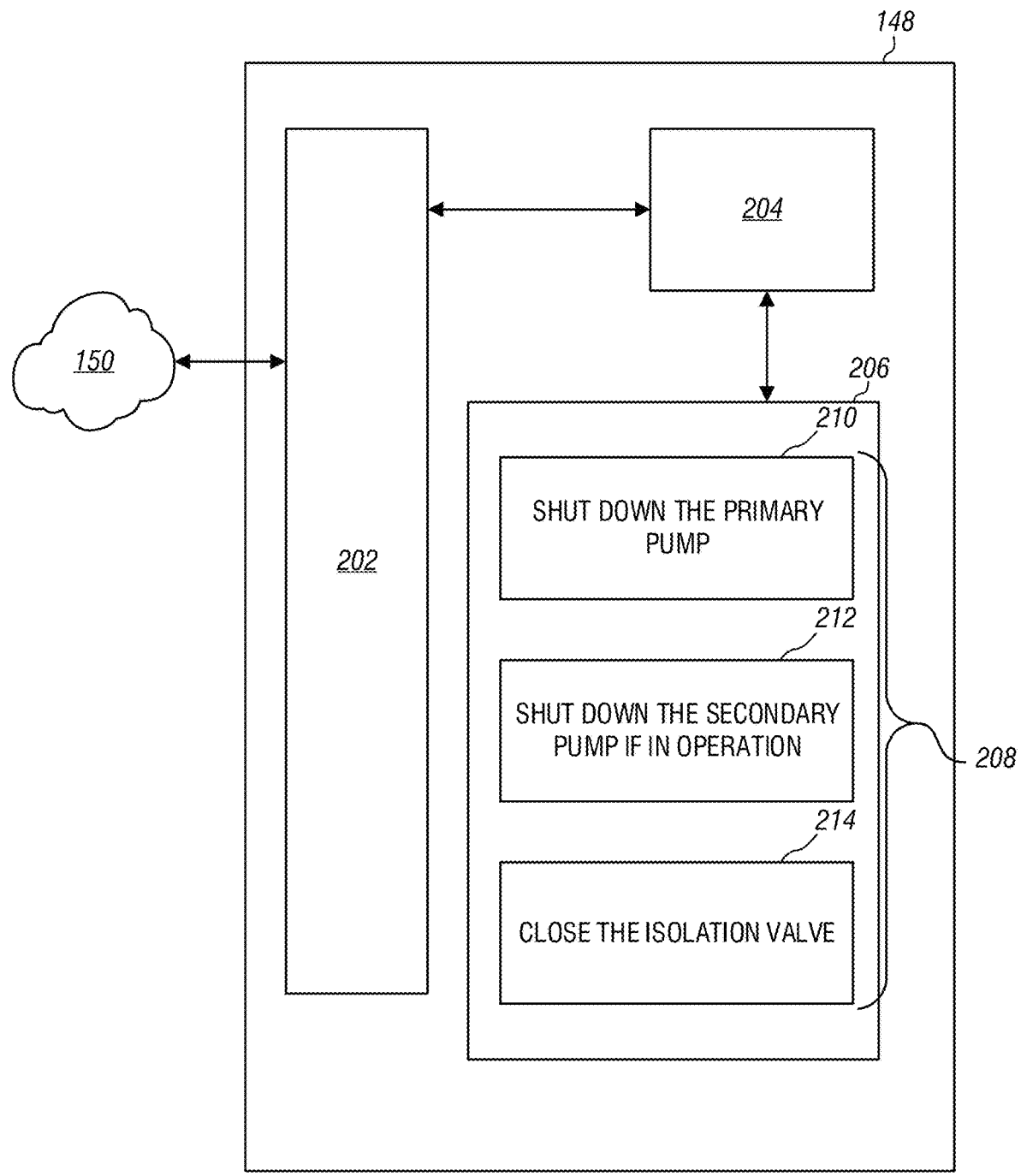
FIG. 2 is a block diagram of a controller communicatively coupled to a network, according to one or more examples of the disclosure.

Referring now to FIG. 2 with continued reference to FIG. 1, FIG. 2 is a block diagram of the controller 148 communicatively coupled to the network 150 shown in FIG. 1, according to one or more examples of the disclosure. The controller 148 may include a network interface 202 communicatively coupled to the network 150 and one or more processors 204 (one shown). A non-transitory computer-readable medium 206 may be communicatively coupled to the processor(s) 204 and the network interface 202 and may store instructions 208 that, when executed by the processor(s) 204, cause the processor(s) 204 to, in response to a leak detected in the closed loop 104: shut down the primary pump 114 (block 210), shut down the secondary pump 140 if in operation (block 212), and close the isolation valve 124 (block 214) to mitigate the leak. The processor 204 may shut down the primary and second pumps 114, 140 and close the isolation valve 124 by, for example, sending signals/messages to the components, via the network 150, instructing them to perform the needed action (i.e., shut down or close). Moreover, the instructions 208 may be configured to cause the processor 204 to perform any of the operations of the methods 300, 400, and/or 500, which are described in greater detail below. The non-transitory computer-readable storage medium 206 may be integrated in the controller 148 as shown in FIG. 2, or the non-transitory computer-readable storage medium 206 may be separate from but accessible to the controller 148.

In one example, the stored instructions 208 can be part of an installation package that when installed can be executed by the processor(s) 204 to implement a leak mitigation system as provided in more detail below. In this case, the non-transitory computer-readable storage medium 206 may be a portable medium such as a compact disc (CD), digital video disc (DVD), or flash drive or a memory maintained by a server from which the installation package can be downloaded or installed. In another example, the stored instructions 208 may be part of an application or applications already installed. Here, the non-transitory computer-readable storage medium 206 can include integrated memory such as hard drive, solid state drive, and the like.

The controller 148, the non-transitory computer readable medium 206 storing the instructions 208 executable by the controller 148, and the isolation valve 124 may form or may be included in a leak mitigation system integrated in the cooling system 100 illustrated in FIG. 1. The leak mitigation system may further include the plurality of sensors 146 in one or more implementations. The leak mitigation system of the present disclosure may be advantageous in that a leak in the closed loop 104 may be stopped in less than about ten seconds, thereby reducing the amount of liquid coolant leaked from the cooling system 100.

Although the example illustrated in FIG. 2 shows the controller 148 being implemented with a processor 204 that is to execute instructions 208, it should be understood that the controller 148 could also be implemented, in whole or in part, using dedicated hardware, such as application-specific integrated circuits (ASICs), complex programmable logic devices (CPLD), and so on. In general, the controller 148 may include logic that is to, in response to a leak detected in the closed loop 104, shut down the primary pump 114 (block 210), shut down the secondary pump 140 if in operation (block 212), and close the isolation valve 124 (block 214) to mitigate the leak, and this logic may include any combination of processors (such as the processor(s) 204), machine readable instructions (such as the instructions 208), and dedicated hardware.

Figure 3:
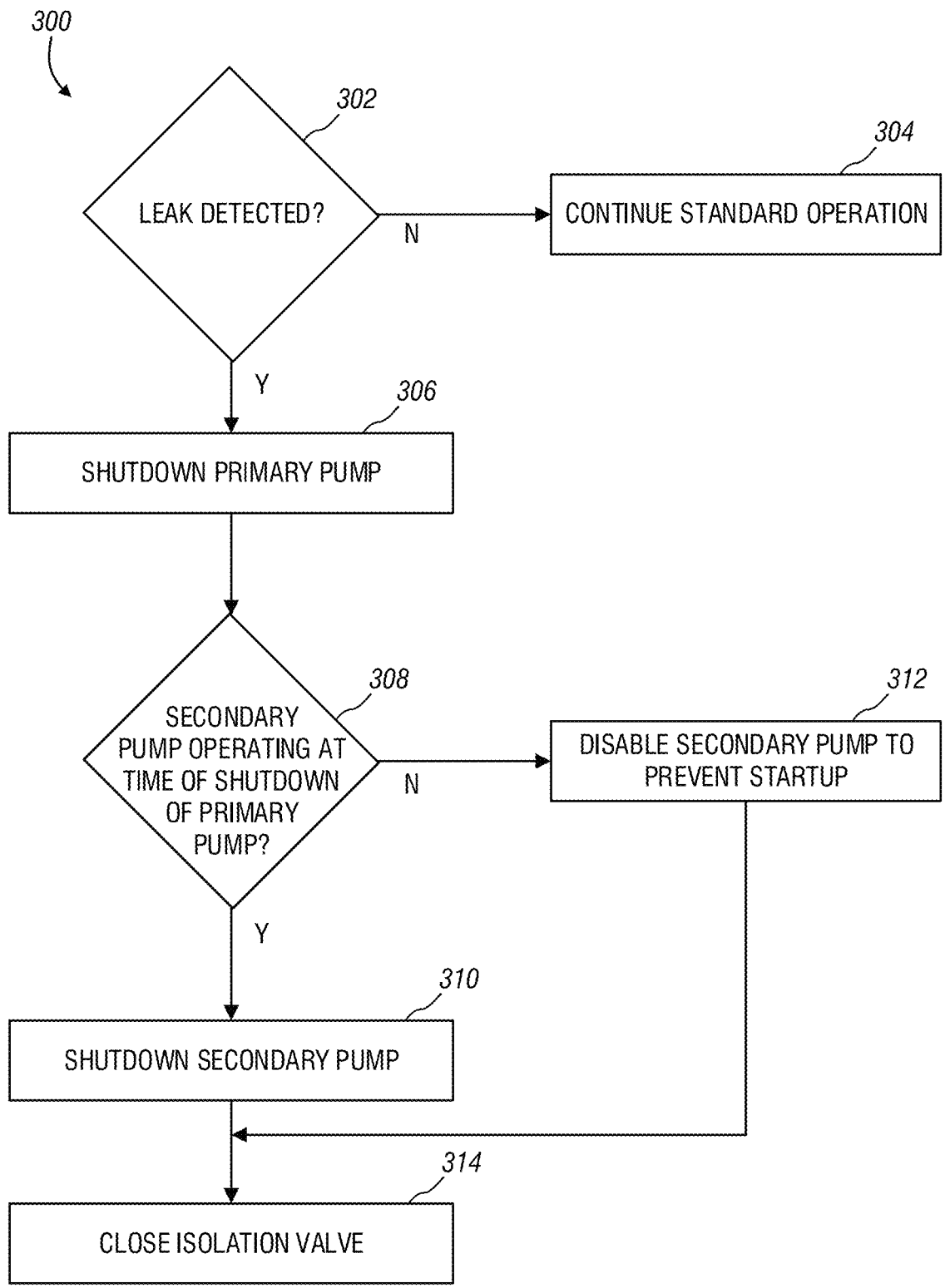
FIG. 3 is a flowchart depicting a method of operation of the cooling system of FIG. 1, according to one or more examples of the disclosure.
Figure 4:
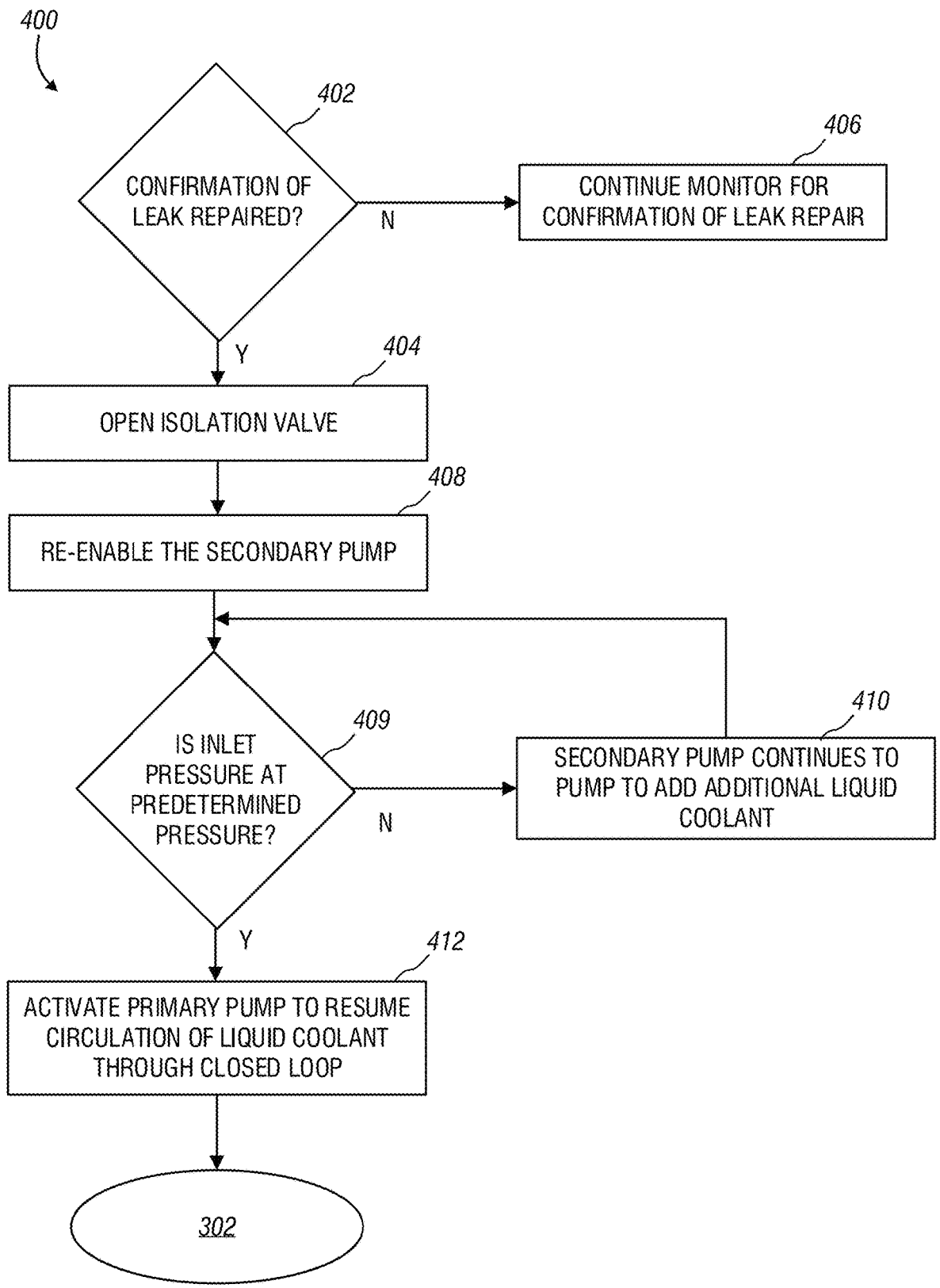
FIG. 4 is a flowchart depicting a method of operation of the cooling system of FIG. 1, according to one or more examples of the disclosure.
Figure 5:
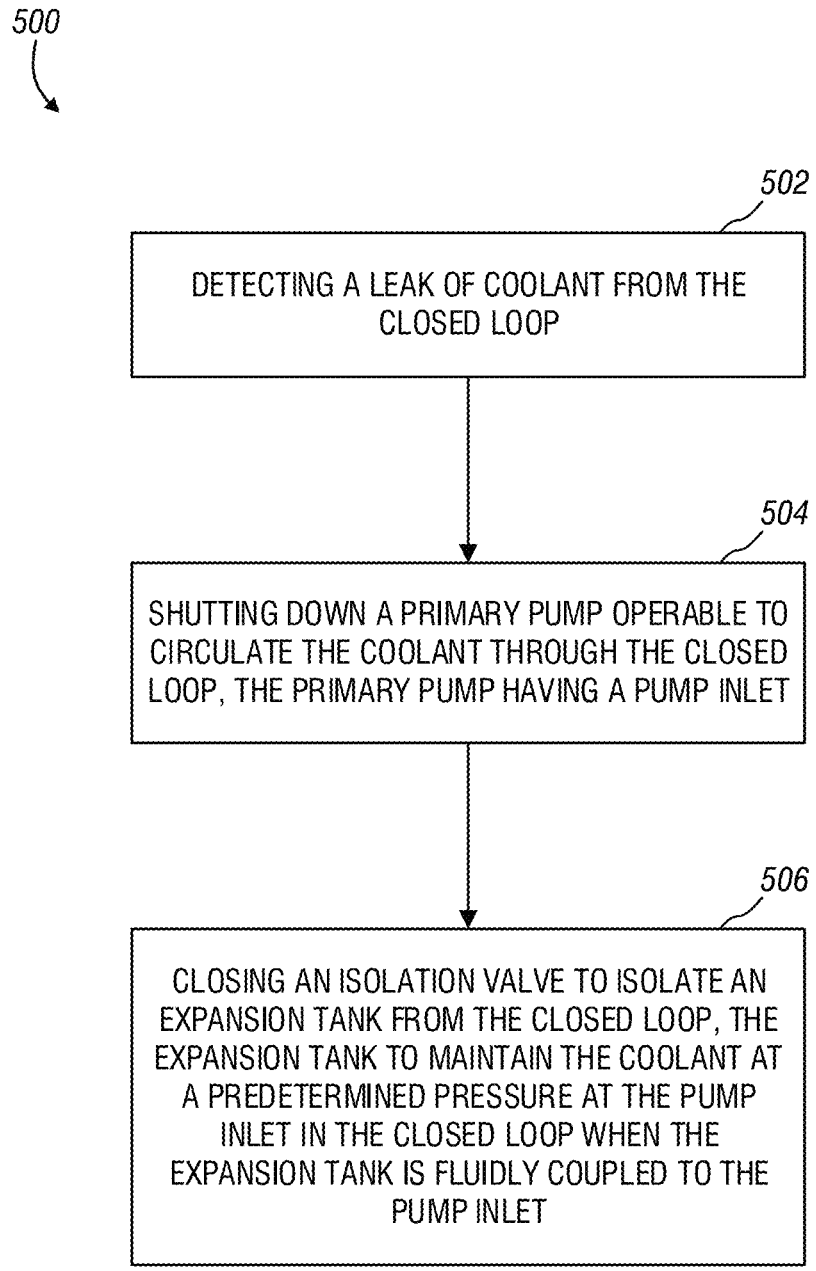
FIG. 5 is a flowchart depicting a method for mitigating a leak in a cooling system having a closed loop, according to one or more examples of the disclosure.

Example methods 300, 400, and 500 for operating the leak mitigation system may now be discussed, in the context of FIGS. 1 and 2, and with reference to FIGS. 3-5. The example methods 300, 400, and/or 500 may be performed, for example, by a controller of a leak mitigation system, such as the controller 148. For example, the controller 148 may execute instructions 208 that cause the controller 148 to perform some or all of the operations of the methods 300, 400, and/or 500. As another example, the controller 148 may include dedicated hardware that performs some or all of the operations of the methods 300, 400, and/or 500.

Referring now to FIG. 3 with continued reference to FIGS. 1 and 2, FIG. 3 is a flowchart depicting a method 300 for operating the leak mitigation system, according to one or more examples of the disclosure. In discussing FIG. 3, reference is made to the cooling system 100 of FIG. 1 and the controller 148 of FIGS. 1 and 2 to provide contextual examples. Implementation, however, is not limited to those examples.

At the leak detection block 302, the leak mitigation system monitors for a leakage of liquid coolant from the closed loop 104. For example, in one or more implementations, the controller 148 may poll the plurality of sensors 146 to determine if any operating parameters (e.g., flow rates, pressures, temperatures) detected are indicative of a leak. In some examples, instead of the controller 148 polling the sensors 146, the sensors 146 may be configured to notify the controller 148 upon one or more operating parameters reaching a predetermined value. In some examples, the leak mitigation system may be configured to detect leaks directly rather than inferring the existence of a leak from operating parameters—for example, the sensors 146 may include moisture sensors that detect the presence of liquid and are positioned in likely leak locations (e.g., near couplings).

If no leak is detected at block 302, the cooling system 100 continues to operate normally, as at block 304. This may include, for example, continuing to monitor for leakage as at block 302.

If a leak is detected in block 302, the controller 148 shuts down the primary pump 114 to stop the pressurization and circulation of the liquid coolant in the closed loop 104, as at block 306. In this context, "shut down" means to stop the pump from pumping. In some examples, this may be accomplished by completely turning off (i.e., powering down) or cutting-off power to the primary pump 114. In other examples, the primary pump 114 may be shut down by instructing the primary pump 114 to stop pumping, without necessarily completely powering down the primary pump 114 (e.g., if the primary pump 114 includes a local controller, the local controller may remain powered on). As part of shutting down the primary pump 114, the controller 148 also disables the primary pump 114 to prevent it from starting pumping again (until the controller 148 determines it should resume operation).

In block 308, the controller 148 determines whether the secondary pump 140 is currently operating. For example, the controller 148 may poll the secondary pump 140 to determine if the secondary pump 140 is operating at the time of shutdown of the primary pump 114 to add additional liquid coolant to the closed loop 104. As another example, the secondary pump 140 may be configured to notify the controller 148 of the secondary pump's 140 operating status (e.g., by asserting a signal line whenever the secondary pump 140 operates for the duration of its operation, or by sending a start message when the secondary pump 140 starts operating and a stop message when the secondary pump 140 stops operating, etc.), in which case the controller 148 may already have the information needed to determine whether the secondary pump 140 is currently operating.

If, in block 308 the secondary pump 140 is actively operating at the time of the shutdown of the primary pump 114, the controller 148 will shut down the secondary pump 140 in parallel with the shutdown of the primary pump 114, as at block 310. As noted above, "shut down" means to stop the pump 140 from pumping, and may be accomplished by completely turning off (i.e., powering down) the secondary pump 140 or by instructing the secondary pump 140 to stop pumping without necessarily completely powering down the secondary pump 140. As part of shutting down the secondary pump 140, the controller 148 may also disable the secondary pump 140 from starting pumping again (until the controller 148 determines the secondary pump 140 should resume operation).

If, at block 308, the secondary pump 140 is not running at the time of the shutdown of the primary pump 114, the controller 148 will disable the secondary pump 140 from starting in response to a reading of a measured pressure from the pressure transducer 144 being less than the predetermined pressure, as at block 312. For example, the secondary pump 140 may include a local controller that determines when to start and stop pumping based on the pressure measured by the pressure transducer 144, and the controller 148 may disable the secondary pump 140 by instructing the secondary pump's 140 local controller to cease activating the secondary pump 140. As another example, the controller 148 may determine when the secondary pump 140 should turn on based on the pressure measured by the pressure transducer 144, in which case the controller 148 may disable the secondary pump 140 by refraining from causing the secondary pump 140 to turn on. As another example, the secondary pump 140 may be disabled by powering down or cutting off power to the secondary pump 140.

At block 314, after shutting down the primary pump 114, and the secondary pump 140 in some instances, the controller 148 will close the isolation valve 124, as at block 314. Shutting down the pump(s) 114, 140 and closing the isolation valve 124 will reduce the pressure in the closed loop 104, for example, to about atmospheric pressure, thereby equalizing the pressure with the surrounding environment and stopping the flow of the liquid coolant from the closed loop 104 to the surrounding environment via the leak. The leak may be repaired in any manner suitable to return the cooling system 100 to standard operation condition.

Referring now to FIG. 4, the example method 400 for operating the leak mitigation system is described. In discussing FIG. 4, reference is made to the cooling system 100 and the controller 148 of FIGS. 1 and 2 to provide contextual examples. Implementation, however, is not limited to those examples. In some examples, the method 400 for operating the leak mitigation system may be performed after the method 300, for example, after the repair of the leak described in FIG. 3.

At block 402, the controller 148 awaits confirmation that the leak has been repaired. The confirmation may be provided by an input received by the controller 148 from a system administrator. In another example, the input may be provided by a response to the controller 148 polling the sensors 146. In any event, if the controller 148 receives confirmation the leak has been repaired or otherwise resolved, the controller 148 opens the isolation valve 124, as at block 404. If the controller 148 does not receive confirmation, the controller 148 continues to monitor for confirmation of the repair of the leak, as at block 406.

In block 408, the controller 148 re-enables the secondary pump 140 to resume normal operation. In this context, the normal operation of the secondary pump 140 includes the secondary pump 140 starting and stopping its pumping based on the pressure at the pump inlet 118. Specifically, once re-enabled the secondary pump 140 starts pumping when the pressure at the pump inlet 118 is less than the predetermined pressure. For example, if the operation of the secondary pump 140 is controlled by a local controller, the controller 148 may re-enable the secondary pump 140 by instructing the local controller to resume normal operation, whereupon the local controller determines whether to start/stop pumping based on the pressure at the pump inlet 118. As another example, if the controller 148 directly controls the operation of the secondary pump 140, then the controller 148 may re-enable the secondary pump 140 by resuming controlling the secondary pump 140 based on the pressure at the pump inlet 118. As another example, if the secondary pump 140 was disabled by powering down or cutting off power to the secondary pump 140, the secondary pump 140 may be re-enabled by restoring power to the secondary pump 140.

After opening the isolation valve 124 and the re-enabling of the secondary pump 140, in block 409 the controller 148 monitors the inlet pressure at the pump inlet 118 via the pressure transducer 144 to determine if the inlet pressure is at the predetermined pressure. If the inlet pressure is less than the predetermined pressure, the secondary pump 140 starts or continues pumping, according to the secondary pump's 140 normal operational principles, to add additional liquid coolant to the closed loop 104 to increase the pressure at the pump inlet 118 as at block 410. The controller 148 continues monitoring the pressure, per block 409, until the inlet pressure reaches the predetermined pressure, whereupon the secondary pump 140 may cease pumping and the process may continue to block 412.

If the inlet pressure is at the predetermined pressure, then at block 412 the controller 148 activates the primary pump 114 to resume circulation of the liquid coolant through the computing devices 102 and the remainder of the closed loop 104, as at block 412. The method for operating the leak mitigation system may then loop back to block 302 to continue monitoring for a leak in the cooling system 100.

FIG. 5 is a flowchart depicting a method 500 for mitigating a leak in a cooling system 100 having a closed loop 104, according to one or more examples of the disclosure. In discussing FIG. 5, reference is made to FIGS. 1 and 2 to provide contextual examples. Implementation, however, is not limited to those examples.

The method 500 may start at block 502 and includes detecting a leak of coolant from the closed loop 104. The method 500 may also include shutting down a primary pump 114 operable to circulate the coolant through the closed loop 104, as at block 504. The primary pump 114 may have a pump inlet 118. The method 500 may further include closing an isolation valve 124 to isolate an expansion tank 122 from the closed loop 104, as at block 506. The expansion tank 122 may maintain the coolant at a predetermined pressure at the pump inlet 118 in the closed loop 104 when the expansion tank 122 is fluidly coupled to the pump inlet 118. In some implementations, the expansion tank 122 may define a chamber 128 including a rubber diaphragm 130 separating the chamber 128 into a gas-filled section 132 and a liquid-filled section 134, and the gas-filled section 132 may contain air at about the predetermined pressure.

In some implementations, the method 500 may also include shutting down a secondary pump 140. The secondary pump 140 may draw additional coolant into the closed loop 104 to maintain the coolant in the closed loop 104 at the predetermined pressure at the pump inlet 118. In some implementations, the method 500 may further include monitoring the closed loop 104 for one or more operating parameters indicative of the leak of the coolant from the closed loop 104. In some implementations, closing the isolation valve 124 to isolate the expansion tank 122 from the closed loop 104, as at block 506, may further include reducing the pressure in the closed loop 104 to about atmospheric pressure.

As used herein, a "processor" may include any circuitry that is capable of executing machine-readable instructions, such as central processing units (CPUs), microprocessors, microcontrollers, digital signal processors (DSPs), field-programmable gate arrays (FPGAs), application-specific instruction set processors (ASIPs), etc.

As provided above, examples in the present disclosure may also be directed to a non-transitory computer-readable medium storing computer-executable instructions and executable by one or more processors of the computer via which the computer-readable medium is accessed. A computer-readable media may be any available media that may be accessed by a computer. By way of example, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Note also that the software implemented aspects of the subject matter claimed below are usually encoded on some form of program storage medium or implemented over some type of transmission medium. The program storage medium is a non-transitory medium and may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The claimed subject matter is not limited by these aspects of any given implementation.

Furthermore, examples disclosed herein may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A leak mitigation system comprising:
an isolation valve to selectively isolate an expansion tank from a closed loop containing a coolant circulated by a primary pump having a pump inlet, the expansion tank to maintain the coolant at a predetermined pressure at the pump inlet in the closed loop and a secondary pump is to maintain the coolant at a predetermined pressure at the pump inlet in the closed loop;
a controller to communicate with the primary pump and the isolation valve; and
a computer-readable storage medium comprising instructions executable by the controller to, in response to a detection of a leak of the coolant from the closed loop:
shut down the primary pump;
close the isolation valve to isolate the expansion tank from the closed loop; and
shut down the secondary pump.

2. The leak mitigation system of claim 1, wherein the computer-readable storage medium further comprises instructions executable by the controller to, in response to a repair of the detected leak:
activate the primary pump to resume circulation of the coolant in the closed loop;
open the isolation valve to fluidly couple the expansion tank to the pump inlet; and
activate the secondary pump to draw additional coolant from a coolant source into the closed loop to maintain the pressure at the pump inlet at the predetermined pressure.

3. The leak mitigation system of claim 1, wherein the computer-readable storage medium further comprises instructions executable by the controller to monitor the closed loop for one or more operating parameters indicative of the leak of the coolant from the closed loop.

4. The leak mitigation system of claim 3, further comprising one or more sensors communicatively coupled to the controller and configured to detect the one or more operating parameters indicative of the leak of the coolant from the closed loop.

5. The leak mitigation system of claim 1, wherein the computer-readable storage medium further comprises instructions executable by the controller to, in response to the detection of the leak of the coolant from the closed loop, reduce the pressure in the closed loop to about atmospheric pressure.

6. A cooling system for a computing device, comprising:
a closed loop configured to transfer thermal energy from the computing device to a coolant circulating though the closed loop, the closed loop comprising
 a primary pump having a pump inlet, the primary pump configured to circulate the coolant through the closed loop;
 an expansion tank to maintain the coolant at a predetermined pressure at the pump inlet when the expansion tank is fluidly coupled to the pump inlet;
 a heat exchanger to remove thermal energy from the closed loop; and
 an isolation valve to selectively isolate the expansion tank from the closed loop;
a controller communicatively coupled to the primary pump and the isolation valve;
a secondary pump to draw additional coolant into the closed loop to maintain the coolant in the closed loop at the predetermined pressure at the pump inlet, wherein the controller is communicatively coupled to the secondary pump; and
a computer-readable storage medium comprising instructions executable by the controller to, in response to a detection of a leak of the coolant from the closed loop:
 shut down the primary pump;
 close the isolation valve to isolate the expansion tank from the closed loop; and
 shut down the secondary pump.

7. The cooling system of claim 6, further comprising:
a coolant fill system including the secondary pump and a coolant reservoir, wherein the secondary pump is to draw the additional coolant from the coolant reservoir to the closed loop.

8. The cooling system of claim 7, further comprising a pressure transducer to measure the pressure at the pump inlet.

9. The cooling system of claim 8, wherein the computer-readable storage medium further comprises instructions executable by the controller to activate the secondary pump to draw the additional coolant into the closed loop in response to the measured pressure at the pump inlet being less than the predetermined pressure.

10. The cooling system of claim 6, wherein the computer-readable storage medium further comprises instructions executable by the controller to, in response to a repair of the detected leak:
 activate the primary pump to resume circulation of the coolant in the closed loop;
 open the isolation valve to fluidly couple the expansion tank to the pump inlet; and
 activate the secondary pump to draw the additional coolant into the closed loop to maintain the pressure at the pump inlet at the predetermined pressure.

11. The cooling system of claim 6, wherein the expansion tank defines a chamber including a rubber diaphragm separating the chamber into a gas-filled section and a liquid-filled section, the gas-filled section containing air at the predetermined pressure.

12. The cooling system of claim 6, wherein the coolant includes water.

13. The cooling system of claim 6, wherein the heat exchanger is a liquid-to-liquid heat exchanger.

14. The cooling system of claim 6, wherein the computer-readable storage medium further comprises instructions executable by the controller to monitor the closed loop for one or more operating parameters indicative of the leak of the coolant from the closed loop.

15. A method for mitigating a leak in a cooling system having a closed loop, the method comprising:
 detecting a leak of coolant from the closed loop;
 shutting down a primary pump operable to circulate the coolant through the closed loop, the primary pump having a pump inlet;
 closing an isolation valve to isolate an expansion tank from the closed loop, the expansion tank to maintain the coolant at a predetermined pressure at the pump inlet in the closed loop when the expansion tank is fluidly coupled to the pump inlet; and
 shutting down a secondary pump, wherein the secondary pump is to draw additional coolant into the closed loop to maintain the coolant in the closed loop at the predetermined pressure at the pump inlet.

16. The method of claim 15, further comprising:
monitoring the closed loop for one or more operating parameters indicative of the leak of the coolant from the closed loop.

17. The method of claim 15, wherein:
closing the isolation valve to isolate the expansion tank from the closed loop further comprises reducing the pressure in the closed loop to atmospheric pressure.

* * * * *